United States Patent
McMahon et al.

(10) Patent No.: US 8,817,570 B2
(45) Date of Patent: Aug. 26, 2014

(54) DEVICES HAVING BIAS TEMPERATURE INSTABILITY COMPENSATION

(75) Inventors: William McMahon, Scarsdale, NY (US); Andreas Kerber, White Plains, NY (US); Tanya Nigam, Sunnyvale, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 264 days.

(21) Appl. No.: 13/372,085

(22) Filed: Feb. 13, 2012

(65) Prior Publication Data
US 2013/0208555 A1  Aug. 15, 2013

(51) Int. Cl.
*G11C 5/14* (2006.01)
(52) U.S. Cl.
USPC .......................................... 365/229; 365/226
(58) Field of Classification Search
CPC ............................ G11C 5/148; G11C 2229/00
USPC .................................................. 365/229, 226
See application file for complete search history.

(56) References Cited

U.S. PATENT DOCUMENTS

| 7,606,076 B2 * | 10/2009 | Nguyen et al. ........... 365/185.21 |
| 8,063,504 B2 * | 11/2011 | Chi .................................... 307/1 |
| 8,305,824 B2 * | 11/2012 | Huang .......................... 365/206 |

OTHER PUBLICATIONS

Kumar et al., "Impact of NTBI on SRAM Read Stability and Design for Reliability," ISQED '06 Proceedings of the 7th International Symposium on Quality Electronic Design, 2006.

* cited by examiner

*Primary Examiner* — Son Dinh
*Assistant Examiner* — Nam Nguyen
(74) *Attorney, Agent, or Firm* — Ingrassia Fisher & Lorenz, P.C.

(57) ABSTRACT

Methods are provided for operating a memory device. An exemplary method involves obtaining a standby current through a memory block and adjusting a supply voltage for the memory block based on the obtained standby current. An exemplary memory device includes a block of one or more memory cells, a voltage regulating element coupled to the block to provide a supply voltage to the block, a current sensing element coupled to the block to measure current through the block, and a control module coupled to the voltage regulating element and the current sensing element to adjust the supply voltage provided by the voltage regulating element based on a measured current through the block obtained from the current sensing element.

18 Claims, 2 Drawing Sheets

DEVICES HAVING BIAS TEMPERATURE INSTABILITY COMPENSATION

TECHNICAL FIELD

Embodiments of the subject matter generally relate to electronics, and more particularly, relate to compensating for the effects of bias temperature instability in integrated circuits and other electronic devices.

BACKGROUND

Bias temperature instability (BTI) is a recognized problem facing designers of integrated circuits and other electronic devices. Over time, BTI tends to increase the threshold voltage of transistors of a device, which in turn, may result in a corresponding decrease in performance and/or reliability. For example, in a static random-access memory (SRAM) cell, an increase in the threshold voltage of one or more of the cross-coupled transistors may impair the ability to read and/or write data from/to the SRAM cell without increasing the read and/or write cycle time. Accordingly, it is desirable to compensate for or otherwise mitigate the effects of BTI in electronic devices to maintain performance and reliability.

BRIEF SUMMARY

In an exemplary embodiment, a method is provided for operating a memory device. The method involves obtaining a standby current through a memory block and adjusting a supply voltage for the memory block based on the obtained standby current.

In another embodiment, a method of operating a memory device including one or more memory cells involves obtaining a cumulative leakage current through the one or more memory cells, determining a voltage adjustment amount based on a difference between the cumulative leakage current and a reference current using a model of a relationship between the cumulative leakage current through the one or more memory cells and the supply voltage for the one or more memory cells, and adjusting the supply voltage for the one or more memory cells by the voltage adjustment amount.

In yet another embodiment, an apparatus for a memory device is provided. The memory device includes a block of one or more memory cells, a voltage regulating element coupled to the block to provide a supply voltage to the block, a current sensing element coupled to the block to measure current through the block, and a control module coupled to the voltage regulating element and the current sensing element. The control module adjusts the supply voltage provided by the voltage regulating element based on a measured current through the block obtained from the current sensing element.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Embodiments of the subject matter described herein generally relate to methods for operating a memory device to compensate for the effects of bias temperature instability (BTI) within transistors of the memory cells within the memory device. As described in greater detail below, the relationship between the standby leakage current and the supply voltage is determined for a block of memory cells, and during operation of the memory device, the supply voltage for that block of memory cells is adjusted based on a recently obtained standby leakage current through the block to thereby compensate for BTI effects within the memory cells based on changes in the standby leakage current through the memory cells. In this regard, as threshold voltages of transistors of the memory cells increase, the standby leakage current through the block of memory cells decreases, and based on this decrease in standby leakage current, the supply voltage of the block of memory cells is increased by an amount determined using the relationship between the standby leakage current and supply voltage for the block that compensates for the increase in threshold voltages. In this manner, the standby leakage current through the block of memory cells is maintained substantially constant or otherwise above a minimum reference current that ensures that the memory cells can be reliably accessed (e.g., read from and/or written to) within the access cycle time previously established for the block over the lifetime of the memory device.

Figure 1:
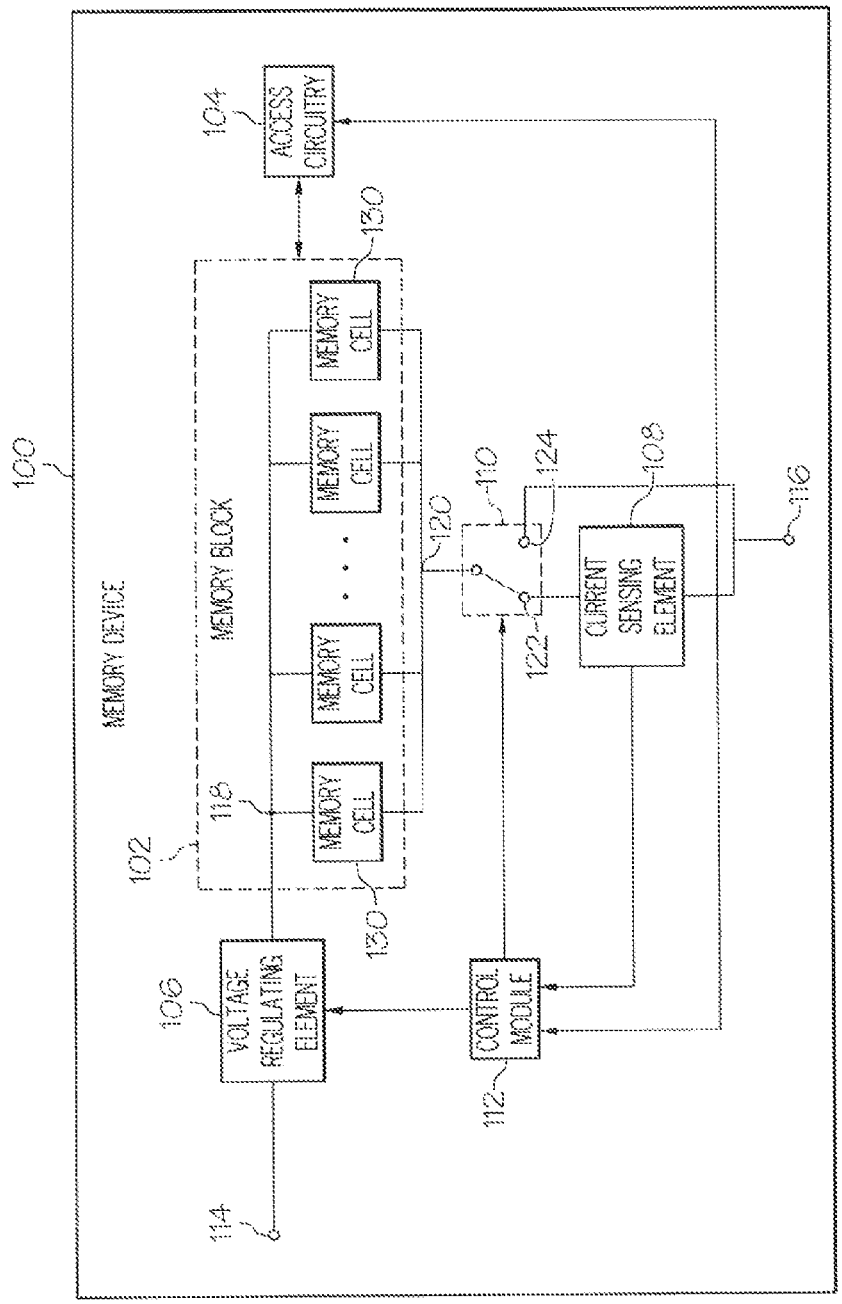
FIG. 1 is a block diagram of an exemplary memory device.

Turning now to FIG. 1, in an exemplary embodiment, a memory device 100 includes, without limitation, a memory block 102, access circuitry 104, a voltage regulating element 106, a current sensing element 108, a switching element 110, and a control module 112. In an exemplary embodiment, the memory device 100 is implemented as an integrated circuit or another electronic device package, wherein the circuit elements and/or electrical components of the memory device 100 are fabricated or otherwise formed on, mounted to, or provided on a semiconductor substrate (or die) for the integrated circuit. It should be understood that FIG. 1 is a simplified representation of the memory device 100 for purposes of explanation and ease of description, and that practical embodiments may include other devices and components to provide additional functions and features, and/or the memory device 100 may be part of a much larger system, as will be understood. For example, a practical embodiment of a memory device may include any number of memory blocks, with each memory block having any number of memory cells as desired to support a particular application. Additionally, although not illustrated in FIG. 1, in practice, the integrated circuit of the memory device 100 will include numerous physical interfaces that provide electrical connections to/from electrical components external to the integrated circuit from/to elements and/or components of the memory device 100.

In an exemplary embodiment, the memory block 102 includes one or more memory cells 130 coupled between a node 118 configured to receive a positive reference (or supply) voltage for the memory block 102 and a node 120 configured to receive a negative reference (or ground) voltage for the memory block 102. In other words, the supply voltage nodes of the memory cells 130 are coupled to the memory block supply voltage node 118 and the ground voltage nodes of the memory cells 130 are coupled to the memory block ground voltage node 120. In exemplary embodiments, the memory cells 130 are realized as static random-access memory (SRAM) cells, as described in greater detail below in the context of FIG. 2.

In the illustrated embodiment of FIG. 1, the access circuitry 104 generally represents the sense amplifiers, write drivers and/or other circuitry coupled to the bit lines and/or word lines of the memory cells 130 and configured to support writing data to and/or reading data from the memory cells 130. When the memory cells 130 are not being accessed by the access circuitry 104, or in other words, when the memory block 102 and/or memory cells 130 are in a standby mode, leakage currents flow through the memory cells 130, as described in greater detail below. In this regard, the memory block supply voltage at the memory block supply voltage node 118 is adjusted based on changes in the leakage current through the memory block 102 to compensate for the changes in the leakage current, and thereby ensuring the access circuitry 104 can reliably access the memory cells 130 within a fixed access duty cycle time (e.g., the read cycle time and/or write cycle time for the memory block 102) during operation of the memory device 100, as described below.

As illustrated in FIG. 1, in an exemplary embodiment, the memory block supply voltage node 118 is coupled to the output of the voltage regulating element 106. The voltage regulating element 106 is coupled to a positive reference (or supply) voltage node 114 for the memory device 100 and provides a regulated voltage for the memory cells 130 at the memory block supply voltage node 118 in response to signals and/or commands from the control module 112. As described in greater detail below in the context of FIG. 3, in exemplary embodiments, the control module 112 provides signals and/or commands to the voltage regulating element 106 that are configured to cause the voltage regulating element 106 to adjust the output voltage at the memory block supply voltage node 118 to compensate for BTI or other circuit-level effects within the memory cells 130 of the memory block 102. In this regard, during operation of the memory device 100, the control module 112 adjusts the voltage provided by the voltage regulating element 106 at memory block supply voltage node 118 to maintain a cumulative standby current through the memory block 102 (e.g., a sum of the individual leakage currents of the memory cells 130) that is substantially constant or otherwise above a reference current value that ensures the memory cells 130 can be reliably accessed. In practice, the voltage regulating element 106 may be realized using a programmable voltage divider or other adjustable voltage regulation circuitry capable of supporting the compensation processes described herein.

Figure 3:
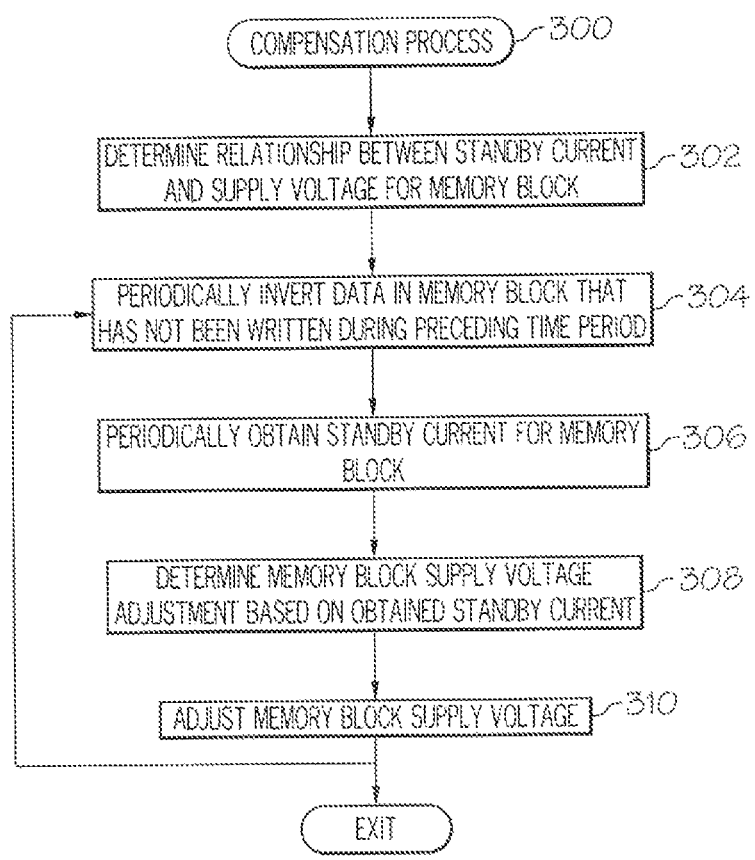
FIG. 3 is a flow diagram of an exemplary compensation process suitable for implementation by the memory device of FIG. 1 in accordance with one or more embodiments.

Still referring to FIG. 1, in an exemplary embodiment, the switching element 110 is coupled between the memory block ground voltage node 120 of the memory block 102 and the negative reference (or ground) voltage node 116 for the memory device 100, and the switching element 110 is capable of selectively coupling the current sensing element 108 electrically in series between the memory block ground voltage node 120 and the memory device ground voltage node 116, as described in greater detail below in the context of FIG. 3. The current sensing element 108 generally represents the circuitry and/or hardware components configured to sense, measure, or otherwise obtain the magnitude of the electrical current flowing in series between the memory block ground voltage node 120 and the memory device ground voltage node 116 when the switching element 110 couples the current sensing element 108 between the nodes 116, 120. In this regard, in the illustrated embodiment, the switching element 110 includes a first terminal (or node) 122 coupled to the current sensing element 108 and a second terminal (or node) 124 coupled to the memory device ground voltage node 116. When the switching element 110 is in the state where it provides an electrical connection between node 122 and the memory block ground voltage node 120, the current sensing element 108 is effectively electrically in series between the memory block ground voltage node 120 and the memory device ground voltage node 116 so that the cumulative current flowing through the memory cells 130 of the memory block 102 flows through or is otherwise capable of being sensed by the 108. In practice, the current sensing element 108 may be realized using a sense resistor or other current sensing circuitry capable of supporting the compensation processes described herein.

In an exemplary embodiment, the control module 112 represents the hardware, processing logic, circuitry and/or other components of the memory device 100 that are configured to operate the voltage regulating element 106 and the switching element 110 to periodically monitor the standby leakage current consumption of the memory block 102, adjust the memory block supply voltage provided by the voltage regulating element 106 based on changes in the standby leakage current, and perform additional tasks and/or functions associated with the operation of the memory device 100 described in greater detail below. Depending on the embodiment, the control module 112 may be implemented or realized with a general purpose processor, a controller, a microprocessor, a microcontroller, a content addressable memory, a digital signal processor, a field programmable gate array, any suitable programmable logic device, discrete gate or transistor logic, discrete hardware components, or any combination thereof, designed to perform the functions described herein. For example, in accordance with one or more embodiments, the control module 112 includes or otherwise accesses a memory or another suitable non-transitory short or long term storage media capable of storing computer-executable programming instructions or other data for execution that, when read and executed by the control module 112, cause the control module 112 to execute and perform one or more of the processes tasks, operations, and/or functions described herein.

Figure 2:
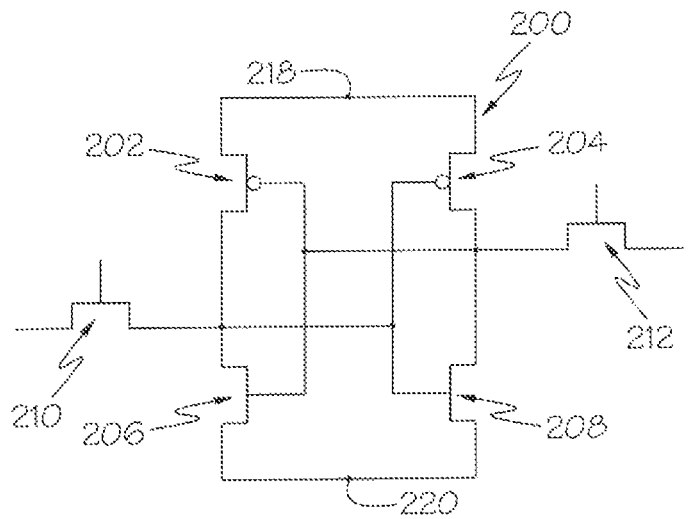
FIG. 2 is a schematic view of an exemplary memory cell suitable for use in the memory device of FIG. 1 in accordance with one or more embodiments.

Referring now to FIG. 2, and with continued reference to FIG. 1, in an exemplary embodiment, the memory cells 130 of the memory block 102 are realized as SRAM cells, such as SRAM cell 200. It should be understood that FIG. 2 is a simplified representation of the SRAM cell 200 for purposes of explanation and ease of description and that practical embodiments may include additional and/or fewer devices and components. In this regard, although FIG. 2 depicts a six transistor SRAM cell, the subject matter described herein is not intended to be limited to any particular memory cell configuration.

The SRAM cell 200 illustrated in FIG. 2 includes a pair of p-type metal-oxide-semiconductor (PMOS) field-effect transistors 202, 204 and a pair of n-type metal-oxide-semiconductor (NMOS) field-effect transistors 206, 208 arranged in a cross-coupled inverter configuration. In this regard, the PMOS transistors 202, 204 function as pull-up transistors having their source terminals coupled to a node 218 (e.g., memory block supply voltage node 118) configured to receive a positive reference (or supply) voltage for the SRAM cell 200 and the NMOS transistors 206, 208 function as pull-down transistors having their source terminals coupled to a node 220 (e.g., memory block ground voltage node 120) configured to receive a negative reference (or ground) voltage for the SRAM cell 200. The SRAM cell 200 also includes access transistors 210, 212 to external access circuitry (e.g., access circuitry 104) to support reading data from and/or writing data to the SRAM cell 200. For example, the source and/or drain terminals of the access transistors 210, 212 may be coupled to the bit lines corresponding to the SRAM cell 200 and the gate terminals of the access transistors 210, 212 may be coupled to the word line corresponding to the SRAM cell 200, wherein the bit lines and word line for the respective SRAM cell 200 are coupled to external access circuitry (e.g., access circuitry 104). As used herein, the standby leakage current of the SRAM cell 200 should be understood as referring to the current that flows between the supply voltage node 218 and the ground voltage node 220 through the cross-coupled transistors 202, 204, 206, 208 when the access transistors 210, 212 are turned off or otherwise deactivated. In other words, the standby leakage current of the SRAM cell 200 is the cumulative current flowing through the transistors 202, 204, 206, 208, 210, 212 of the SRAM cell 200 when the access transistors 210, 212 are turned off. In the standby mode, one of the PMOS transistors (e.g., PMOS transistor 202) will be turned on and its series coupled NMOS transistor (e.g., NMOS transistor 206) will be turned off while the other PMOS transistor (e.g., PMOS transistor 204) will be turned off and the other NMOS transistor (e.g., NMOS transistor 208) will be turned on, thereby facilitating a standby leakage current flowing between the supply voltage node 218 and the ground voltage node 220 through the cross-coupled transistors that are turned on (e.g., PMOS transistor 202 and NMOS transistor 208).

FIG. 3 depicts an exemplary compensation process 300 suitable for implementation by a memory device to compensate for potential effects of BTI in memory cells of the memory device. The various tasks performed in connection with the compensation process 300 may be performed by software, hardware, firmware, or any combination thereof. For illustrative purposes, the following description may refer to elements mentioned above in connection with FIGS. 1-2. In practice, portions of the compensation process 300 may be performed by different elements of the memory device 100, such as, for example, the access circuitry 104, the voltage regulating element 106, the current sensing element 108, the switching element 110, and/or the control module 112. It should be appreciated that the compensation process 300 may include any number of additional or alternative tasks, the tasks need not be performed in the illustrated order and/or the tasks may be performed concurrently, and/or the compensation process 300 may be incorporated into a more comprehensive procedure or process having additional functionality not described in detail herein. Moreover, one or more of the tasks shown and described in the context of FIG. 3 could be omitted from a practical embodiment of the compensation process 300 as long as the intended overall functionality remains intact.

Referring to FIG. 3, and with continued reference to FIGS. 1-2, in an exemplary embodiment, the compensation process 300 begins by obtaining or otherwise determining a relationship between memory block supply voltage and the standby current consumption for a memory block (task 302). In an exemplary embodiment, the cumulative standby leakage current through the memory cells 130 of the memory block 102 is modeled or otherwise characterized as a function of the memory block supply voltage at memory block supply voltage node 118. For example, the standby leakage current through the memory block 102 may be measured across a range of supply voltages for different configurations of bits stored by the memory cells 130 and then averaged to obtain a curve (or function) representative of the average standby leakage current through the memory block 102 as a function of the memory block supply voltage. In this regard, the standby leakage current model accounts for variations across the different memory cells 130 and variations in the bits of data maintained by the memory cells 130. In an exemplary embodiment, the standby leakage current model also accounts for variations in the relationship between the standby leakage current memory block supply voltage due to BTI, for example, by simulating increases in the threshold voltages of the transistors of the memory cells 130 and calculating or otherwise determining the cumulative standby leakage current across a range of supply voltages and different configurations of bits, which is also utilized when developing the model of the standby leakage current with respect to the memory block supply voltage. The standby leakage current model may also account for variations in the standby leakage current with respect to variations in the temperature of the memory cells 130, for example, by calculating or otherwise determining the cumulative standby leakage current across a range of temperatures and utilizing the relationship between standby leakage current and temperature when developing the standby leakage current model. In exemplary embodiments, the standby current through the memory block 102 is characterized prior to being deployed in the memory device 100 and the control module 112 is provisioned with or otherwise configured to store the standby leakage current model for the memory block 102 (e.g., the curve or function representing the relationship between the cumulative standby leakage current through the memory cells 130 and the memory block supply voltage at memory block supply voltage node 118). In other embodiments, the control module 112 may determine a standby leakage current model for the memory block 102 by disabling or otherwise deactivating the access circuitry 104 (e.g., to ensure the access transistors 210, 212 of the memory cells 130, 200 are turned off), activating the switching element 110 to provide the current sensing element 108 in series between the memory device ground voltage node 116 and memory block ground voltage node 120, providing signals and/or commands to vary the voltage output by the voltage regulating element 106 at memory block supply voltage node 118, obtaining the standby current measured (or sensed) by the current sensing element 108, and calculating or otherwise determining the standby leakage current model based on the memory block supply voltages provided by the voltage regulating element 106 and the current measured by the current sensing element 108.

After the relationship between memory block supply voltage and standby current for the memory block 102 is determined, the control module 112 stores or otherwise maintains the standby leakage current model and configures the voltage regulating element 106 to provide an initial memory block supply voltage at memory block supply voltage node 118 that is chosen to achieve one or more desired performance metrics for the memory block 102 and/or the memory device 100. The control module 112 may also obtain the initial standby current through the memory block 102 sensed and/or measured by the current sensing element 108 and store or otherwise maintain the initial standby current in memory along with the standby leakage current model for the memory block 102 and the initial memory block supply voltage.

In an exemplary embodiment, during operation of the memory device, the compensation process 300 continues by periodically inverting the bits of data maintained or stored by the memory block (task 304). In this regard, when a memory cell 130, 200 maintains a constant logic value, BTI effects may asymmetrically increase the threshold voltages of the transistors of the memory cell 130, 200. For example, the threshold voltages of pull-up transistor 202 and pull-down transistor 206 may increase due to BTI effects while the threshold voltages of the remaining transistors 204, 208 are unchanged or increase by a lesser amount. Asymmetric threshold voltage increases for transistors of a memory cell 130, 200 increases the likelihood of unsuccessfully accessing the memory cell 130, 200, for example, by increasing the amount of time required to read data from the memory cell 130, 200. Accordingly, in an exemplary embodiment, the control module 112 periodically inverts the bits of data maintained by the memory cells 130, 200 of the memory block 102 if the bits of data maintained by the memory cells 130, 200 have not changed during a preceding time interval to maintain substantially symmetric threshold voltages for the transistors of the memory cells 130, 200. For example, the memory block 102 may include or otherwise be associated with a bit that indicates whether the memory block 102 was written to during a preceding time interval along with a bit that indicates whether the data in the memory block 102 is inverted. At the end of a particular time interval, the control module 112 obtains or otherwise checks the bit indicating whether the memory block 102 was written to during the preceding time interval, and when the bit indicates that the memory block 102 was not written to during the preceding time interval, the control module 112 reads or otherwise obtains the bits of data maintained by the memory cells 130 via the access circuitry 104, inverts the obtained bits of data, writes the inverted bits of data to the memory cells 130 via the access circuitry 104, and modifies the other bit of the memory block 102 to indicate that the data in the memory block 102 is inverted. Conversely, when the bit indicates that the memory block 102 was written to during the preceding time interval, the control module 112 resets the bit for the subsequent time interval. When data is written to a memory block 102 during the subsequent time interval, the control module 112 sets the bits to indicate that the memory block 102 was written to and that the data is not inverted. When data is read from the memory block 102 during a subsequent time interval, the control module 112 obtains or otherwise checks the bit that indicates whether the data is inverted, and when the data is inverted, the control module 112 inverts the bits of data read from the memory block 102 to their original non-inverted state before providing the data to devices or other elements external to the memory device 100 (e.g., to a processor coupled the memory device 100).

In an exemplary embodiment, the compensation process 300 continues by periodically obtaining the standby current through the memory block, and based on the obtained standby current, determining an amount by which the memory block supply voltage should be adjusted to compensate for BTI or other circuit-level effects and adjusting the memory block supply voltage by that amount (tasks 306, 308, 310). In this regard, an increase in threshold voltages of the transistors of a memory cell 130, 200 attributable to BTI effects reduces the likelihood of successfully accessing that memory cell 130, 200 during a fixed time period without compensating for the threshold voltage increases. At the same time, an increase in the threshold voltage of a transistor of a memory cell 130, 200 produces a decrease in the leakage current through that transistor for a given supply voltage. Accordingly, based on the decrease in the standby leakage current for the memory block 102 and the standby leakage current model for the memory block 102, the control module 112 determines an amount by which the memory block supply voltage at memory block supply voltage node 118 should be increased to compensate for the threshold voltage increases caused by BTI or other circuit-level effects and thereby reduce the likelihood of unsuccessfully accessing one or more of the memory cells 130, 200. To put it another way, the memory block supply voltage at node 118 is increased by an amount that ensures the memory cells 130, 200 can be reliably accessed.

As described above, to obtain the cumulative standby leakage current through the memory cells 130, 200 of the memory block 102, the control module 112 disables or otherwise deactivates the access circuitry 104 and activates the switching element 110 to couple the current sensing element 108 in series between the memory device ground voltage node 116 and the memory block ground voltage node 120. In an exemplary embodiment, the control module 112 determines a difference between the standby current obtained from the current sensing element 108 and a reference standby current, and based on that difference, utilizes the previously determined relationship between standby current and supply voltage for the memory block 102 to determine an amount by which the voltage output of the voltage regulating element 106 should be adjusted to reduce or otherwise eliminate the difference between the measured current through the memory block 102 and the reference current. In accordance with one embodiment, the reference current is a minimum standby leakage current for the memory block 102 that is determined based on an access duty cycle for the memory block 102. For example, during characterization of the memory block 102, a standby leakage current that provides a sufficiently high likelihood of successfully accessing the memory cells 130, 200 may be determined or otherwise identified as a minimum standby leakage current. In other words, the minimum standby leakage current corresponds to a tolerable increase in threshold voltages of the transistors of the memory cells 130, 200 that still allows the memory cells 130, 200 to be accessed within the shortest access duty cycle (e.g., the shortest of the read and write cycle times) for the memory block 102 with a sufficiently high likelihood of success. When the obtained standby current is less than the minimum standby leakage current, the control module 112 utilizes the standby leakage current model for the memory block 102 to determine an amount by which the voltage output of the voltage regulating element 106 should be increased to ensure that the standby current through the memory block 102 is greater than or equal to the minimum standby leakage current. In this manner, the voltage adjustment amount compensates for the difference between the obtained standby current and the minimum standby current. After determining the voltage adjustment amount, the control module 112 signals or otherwise commands the voltage regulating element 106 to adjust the memory block supply voltage at memory block supply voltage node 118 by the voltage adjustment amount. Thus, when the threshold voltages of the transistors of the memory cells 130, 200 increase, the memory block supply voltage is increased by a corresponding amount based on the decrease in standby leakage current caused by the threshold voltage increases, thereby ensuring that the memory cells 130, 200 of the memory block 102 can be accessed within the access duty cycle with a sufficiently high likelihood of success. After the configuring the voltage regulating element 106 to provide the adjusted memory block supply voltage, the control module 112 activates the switching element 110 to decouple the current sensing element 108 from between nodes 116, 120 and enables the access circuitry 104 for continued operation of the memory device 100 with the adjusted memory block supply voltage.

In accordance with one or more alternative embodiment, the reference current is the initial standby leakage current for the memory block 102 obtained by the control module 112 when the memory device 100 initializes or otherwise begins operation. In this regard, when the obtained standby current is less than the initial standby leakage current, the control module 112 utilizes the standby leakage current model for the memory block 102 to determine an amount by which the voltage output of the voltage regulating element 106 should be increased to ensure that the standby current through the memory block 102 is substantially equal to the initial standby leakage current. In this manner, the voltage adjustment amount compensates for increases in the threshold voltages of the transistors of the memory cells 130, 200 and maintains a substantially constant standby leakage current through the memory block 102. In another alternative embodiment, the control module 112 utilizes the standby leakage current model for the memory block 102 to calculate or otherwise determine an average amount by which the threshold voltages of the transistors of the memory cells 130, 200 have increased based on the obtained standby leakage current, and then signals or otherwise commands the voltage regulating element 106 to increase the memory block supply voltage by that amount (e.g., the average threshold voltage increase across the memory cells 130, 200 of the memory block 102). In other words, the control module 112 may increase memory block supply voltage by an amount greater than or equal to the increase in the threshold voltages of the transistors of the memory cells 130, 200.

Still referring to FIG. 3, after increasing the memory block supply voltage based on decreases in the cumulative standby leakage current through the memory cells to compensate for increases in the threshold voltages of the transistors of the memory cells, the loop defined by tasks 304, 306, 308 and may repeat as desired throughout operation of the memory device. In this regard, the control module 112 periodically inverts the bits of data maintained by the memory cells 130, 200 of the memory block 102 to ensure increases in the threshold voltages of the transistors of the memory cells 130, 200 attributable to BTI or other effects are substantially symmetrical and periodically increases the memory block supply voltage at memory block supply voltage node 118 to compensate for any increases in the threshold voltages throughout operation of the memory device 100. Thus, the compensation process 300 reduces the likelihood of BTI or other effects impairing operation of the memory device 100 over the lifetime of the memory device 100 and maintains a sufficiently high likelihood of successfully accessing the memory cells 130, 200 without increasing the access duty cycle(s).

For the sake of brevity, conventional techniques related to memory cells, memory accesses or other memory operations, voltage regulation, current sensing, signaling, field-effect transistors, BTI, and other functional aspects of the subject matter may not be described in detail herein. As used herein, a "node" means any internal or external reference point, connection point, junction, signal line, conductive element, or the like, at which a given signal, logic level, voltage, data pattern, current, or quantity is present. Additionally, certain terminology may also be used herein for the purpose of reference only, and thus is not intended to be limiting, and the terms "first", "second" and other such numerical terms referring to structures do not imply a sequence or order unless clearly indicated by the context. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the figures depict direct electrical connections between circuit elements and/or terminals, alternative embodiments may employ intervening circuit elements and/or components while functioning in a substantially similar manner.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of operating a memory device including a memory block, the method comprising:
    obtaining a standby current through the memory block, resulting in an obtained standby current;
    disable access circuitry coupled to the memory block prior to obtaining the standby current;
    adjusting a supply voltage for the memory block based on the obtained standby current; and
    enable the access circuitry after adjusting the supply voltage.

2. The method of claim 1, wherein:
    the memory block includes a plurality of memory cells; and
    obtaining the standby current comprises obtaining a cumulative leakage current through the plurality of memory cells.

3. The method of claim 1, wherein adjusting the supply voltage comprises increasing the supply voltage by an amount that compensates for a difference between the obtained standby current and a reference current.

4. The method of claim 3, further comprising calculating the amount based on a relationship between standby current and memory block supply voltage for the memory block.

5. The method of claim 1, further comprising obtaining an initial standby current through the memory block, wherein adjusting the supply voltage comprises adjusting the supply voltage based on a difference between the obtained standby current and the initial standby current.

6. The method of claim 1, further comprising determining a relationship between standby current and memory block supply voltage for the memory block, wherein adjusting the supply voltage comprises:

determining an adjustment amount based on the obtained standby current and the relationship between standby current and memory block supply voltage for the memory block; and adjusting the supply voltage by the adjustment amount.

7. The method of claim 6, wherein determining the adjustment amount comprises:

determining a difference between the obtained standby current and a reference current; and determining the adjustment amount that compensates for the difference based on the relationship between standby current and memory block supply voltage for the memory block.

8. The method of claim 7, further comprising determining the reference current based on an access duty cycle for the memory block.

9. The method of claim 8, wherein determining the reference current comprises determining a minimum standby current for the memory block based on the access duty cycle, the adjustment amount compensating for the difference between the obtained standby current and the minimum standby current.

10. A method of operating a memory device including one or more memory cells, the method comprising:

obtaining a cumulative leakage current through the one or more memory cells;

determining a voltage adjustment amount based on a difference between the cumulative leakage current and a reference current using a model of a relationship between the cumulative leakage current through the one or more memory cells and the supply voltage for the one or more memory cells; and adjusting the supply voltage for the one or more memory cells by the voltage adjustment amount.

11. The method of claim 10, further comprising periodically inverting bits of data maintained by the one or more memory cells.

12. The method of claim 10, wherein determining the voltage adjustment amount comprises calculating the voltage adjustment amount to reduce the difference using the model.

13. The method of claim 12, further comprising obtaining an initial cumulative leakage current through the one or more memory cells, wherein determining the voltage adjustment amount comprises determining the voltage adjustment amount that compensates for a difference between the cumulative leakage current and the initial cumulative leakage current using the model.

14. A memory device comprising:

a block of one or more memory cells;

a voltage regulating element coupled to the block to provide a supply voltage to the block;

a current sensing element coupled to the block to measure current through the block; and a control module coupled to the voltage regulating element and the current sensing element to adjust the supply voltage provided by the voltage regulating element based on a measured current through the block obtained from the current sensing element, wherein the control module is configured to determine a voltage adjustment amount based on a difference between the measured current and a reference current using a standby leakage current model for the block, and command the voltage regulating element to adjust the supply voltage by the voltage adjustment amount.

15. The memory device of claim 14, further comprising access circuitry coupled to the block to access the one or more memory cells, wherein the control module is configured to disable the access circuitry prior to obtaining the measured current from the current sensing element.

16. The memory device of claim 14, wherein the control module is configured to:

obtain an initial standby current from the current sensing element;

determine a voltage adjustment amount to compensate for a difference between the measured current and the initial standby current using a standby leakage current model for the block; and command the voltage regulating element to adjust the supply voltage by the voltage adjustment amount.

17. The memory device of claim 14, further comprising access circuitry coupled to the block to access the one or more memory cells within an access duty cycle, wherein the control module is configured to:

determine a voltage adjustment amount based on a difference between the measured current and a minimum standby current for the block based on the access duty cycle using a standby leakage current model for the block; and command the voltage regulating element to increase the supply voltage by the voltage adjustment amount.

18. The memory device of claim 14, further comprising access circuitry coupled to the block to access the one or more memory cells, wherein the control module is coupled to the access circuitry and configured to periodically invert bits of data maintained by the one or more memory cells.

* * * * *